US012039189B2

(12) United States Patent
Basso et al.

(10) Patent No.: US 12,039,189 B2
(45) Date of Patent: Jul. 16, 2024

(54) IDLE MODE TEMPERATURE CONTROL FOR MEMORY SYSTEMS

(71) Applicant: Micron Technology, Inc., Boise, ID (US)

(72) Inventors: Francesco Basso, Portici (IT); Antonino Pollio, Vico Equense (IT); Francesco Falanga, Quarto (IT); Massimo Iaculo, San Marco Evangelista (IT)

(73) Assignee: Micron Technology, Inc., Boise, ID (US)

( * ) Notice: Subject to any disclaimer, the term of this patent is extended or adjusted under 35 U.S.C. 154(b) by 30 days.

(21) Appl. No.: 17/900,361

(22) Filed: Aug. 31, 2022

(65) Prior Publication Data

US 2024/0069784 A1 Feb. 29, 2024

(51) Int. Cl.
*G06F 3/06* (2006.01)
(52) U.S. Cl.
CPC .......... *G06F 3/0653* (2013.01); *G06F 3/0604* (2013.01); *G06F 3/0652* (2013.01); *G06F 3/0679* (2013.01)
(58) Field of Classification Search
CPC .... G06F 3/0653; G06F 3/0604; G06F 3/0652; G06F 3/0679; G06F 3/06
See application file for complete search history.

(56) References Cited

U.S. PATENT DOCUMENTS

| 11,231,874 | B2 * | 1/2022 | Nishikawa | G06F 3/0614 |
| 2017/0255403 | A1 * | 9/2017 | Sharon | G06F 3/064 |
| 2019/0145835 | A1 * | 5/2019 | Jadhav | G06F 13/4022 710/5 |
| 2020/0348887 | A1 * | 11/2020 | Kim | G06F 3/0619 |
| 2021/0240381 | A1 * | 8/2021 | Sato | G11C 16/10 |
| 2022/0326862 | A1 * | 10/2022 | Chen | G06F 1/206 |

* cited by examiner

*Primary Examiner* — Khoa D Doan
(74) *Attorney, Agent, or Firm* — Holland & Hart LLP

(57) ABSTRACT

Methods, systems, and devices for idle mode temperature control for memory systems are described. A memory system may implement the use of one or more dummy access commands to reduce the effects of errors introduced by temperature changes while the memory system is in an idle mode. For example, performing one or more access commands, such as one or more read commands, may increase a temperature of a memory device and support a desired operating temperature for the memory device while the memory system is in the idle mode. The memory system may measure the temperature of the memory device during the idle mode. If the memory system determines that the temperature of the memory device has fallen below a threshold temperature, the memory system may issue a quantity of dummy access commands to the memory device, and the corresponding dummy access operations may result in a temperature increase at the memory device.

24 Claims, 7 Drawing Sheets

IDLE MODE TEMPERATURE CONTROL FOR MEMORY SYSTEMS

FIELD OF TECHNOLOGY

The following relates to one or more systems for memory, including idle mode temperature control for memory systems.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
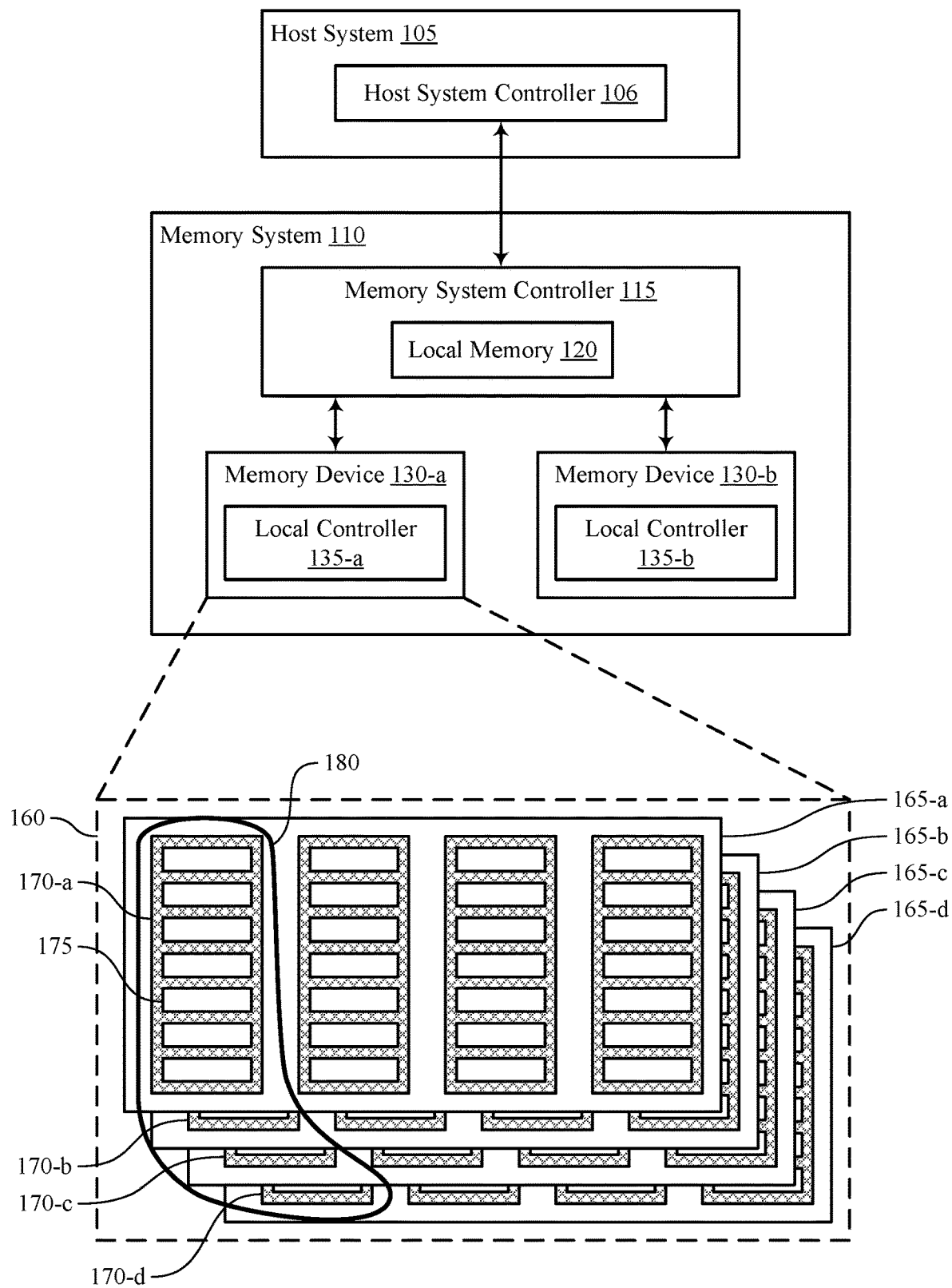
FIG. 1 illustrates an example of a system that supports idle mode temperature control for memory systems in accordance with examples as disclosed herein.

A memory system (e.g., a memory system implemented in a vehicle) may be associated with an operating temperature range (e.g., −40° C. to 115° C.). In some cases, when the temperature of the memory system reaches or goes below a temperature threshold (e.g., −30° C., less than −40° C.), data programmed at a higher temperature may be associated with one or more errors (e.g., read errors) as a result of, among other aspects, variations in threshold voltage distributions (e.g., of memory cells of the memory system) due to the temperature variation. The memory system may be configured to manage the variations in threshold voltage distributions while the memory system is active. However, the memory system may enter an idle mode (e.g., a low power mode, a powered off state of the memory system, a standby mode) and temperature changes (e.g., temperature drops in the environment) may result in cell voltage distribution shifts that may not be corrected by the memory system while the memory system is in the idle mode. For example, the memory system may be implemented in a non-temperature controlled environment (e.g., in a vehicle), and the memory system may be subject to temperature changes while in the idle mode. In some cases, voltage distribution shifts may result in access operation errors (e.g., read errors) when the memory system exits the idle mode (e.g., is powered back on). For example, a voltage distribution shift may cause threshold voltage distributions for different logic states to overlap, and a memory cell corresponding to one logic state may be read as a different logic state based on (e.g., as a result of) the voltage distribution overlap.

A memory system may implement one or more dummy access commands (e.g., an access command used to increase temperature, rather than access memory cells for read, write, refresh, or other operations) to reduce the effects of errors introduced by temperature changes (e.g., from a voltage distribution overlap) while the memory system is in the idle mode. For example, performing one or more dummy access commands, such as one or more dummy read commands, may increase the temperature of a memory device (e.g., as a result of an applied voltage) and may support a desired operating temperature for the memory device while the memory system is in the idle mode. The memory system may measure the temperature of a memory device during the idle mode (e.g., periodically). If the memory system determines that the temperature of the memory device has fallen below a threshold temperature, the memory system may issue a quantity of dummy access commands (e.g., dummy read commands) to the memory device, and the corresponding dummy access operations may result in a temperature increase at the memory device. In some cases, the quantity of dummy access operations may be based on (e.g., proportional to) the temperature of the memory device, a difference between the temperature of the memory device and a threshold temperature, a rate of change of temperature of the memory device compared to a previous temperature measurement (e.g., in response to previous dummy access operations), other aspects or conditions, or any combination thereof. Performing dummy access operations to increase the temperature of the memory device may reduce the effects of temperature changes during idle modes and increase reliability of the memory system while supporting reduced power consumption (e.g., by avoiding exiting the idle mode), among other benefits.

Figure 2:
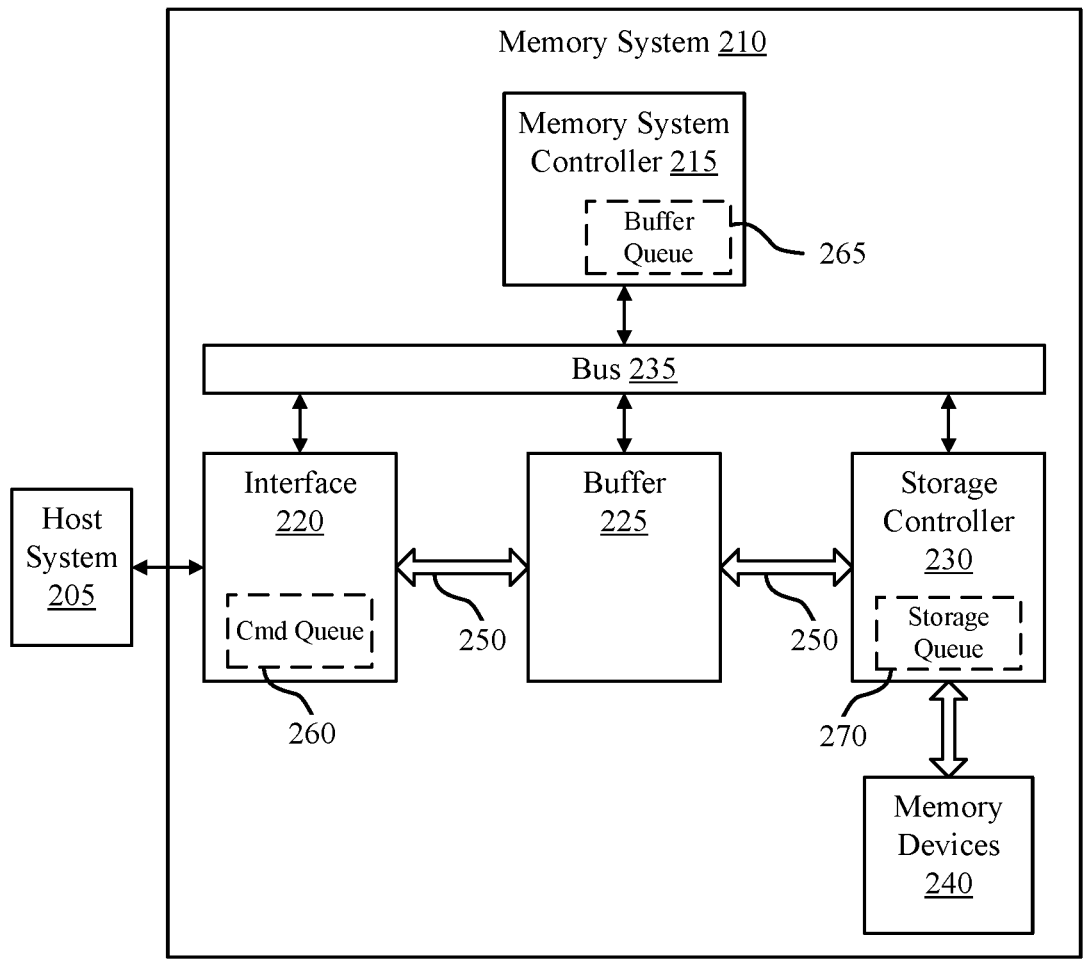
FIG. 2 illustrates an example of a system that supports idle mode temperature control for memory systems in accordance with examples as disclosed herein.

Features of the disclosure are initially described in the context of systems, devices, and circuits with reference to FIGS. 1 through 2. Features of the disclosure are described in the context of voltage distribution diagrams, a memory system, and a process flow with reference to FIGS. 3 through 5. These and other features of the disclosure are further illustrated by and described in the context of an apparatus diagram and flowchart that relate to idle mode temperature control for memory systems with reference to FIGS. 6 and 7.

FIG. 1 illustrates an example of a system 100 that supports idle mode temperature control for memory systems in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hardcoded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally, or alternatively, include static random access memory (SRAM) or other memory that may be used by the memory system controller 115 for internal storage or calculations, for example, related to the functions ascribed herein to the memory system controller 115. Additionally, or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally, or alternatively, rely on an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally, or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a die 160 (e.g., a memory die). For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally, or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may be performed on different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, L2P mapping tables may be maintained and data may be marked as valid or invalid at the page level of granularity, and a page 175 may contain valid data, invalid data, or no data. Invalid data may be data that is outdated due to a more recent or updated version of the data being stored in a different page 175 of the memory device 130. Invalid data may have been previously programmed to the invalid page 175 but may no longer be associated with a valid logical address, such as a logical address referenced by the host system 105. Valid data may be the most recent version of such data being stored on the memory device 130. A page 175 that includes no data may be a page 175 that has never been written to or that has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

The system 100 may include any quantity of non-transitory computer readable media that support idle mode temperature control for memory systems. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

The memory system 110 may be configured to manage variations in threshold voltage distributions while the memory system 110 is active. However, the memory system 110 may enter an idle mode and temperature changes may result in voltage distribution shifts that may not be corrected while the memory system 110 is in the idle mode. In some cases, voltage distribution shifts may result in access operation errors (e.g., read errors) if the memory system 110 exits the idle mode. For example, a voltage distribution shift may cause threshold voltage distributions for different logic states to overlap, and a memory cell corresponding to one logic state may be read as a different logic state based on (e.g., as a result of) the voltage distribution overlap.

The memory system 110 may implement the use of dummy access commands, such as read commands, to reduce the effects of errors induced by temperature changes while the memory system 110 is in the idle mode. For example, performing an access command, such as a read command, may increase the temperature of the memory device 130 (e.g., as a result of an applied voltage) and allow the memory device 130 to maintain a desired operating temperature while the memory system 110 is in the idle mode. The memory system 110 may measure the temperature of the memory device 130 during the idle mode (e.g., periodically). If the memory system 110 determines that the temperature of the memory device 130 has fallen below a threshold temperature the memory system 110 may issue a quantity of dummy access commands (e.g., read commands) to the memory device 130, and the corresponding dummy access operations may result in a temperature increase at the memory device 130. In some cases, the quantity of dummy access operations may be based on (e.g., determined by) the temperature of the memory device 130, a rate of change of temperature of the memory device 130 compared to a previous temperature measurement, or any combination thereof. Performing dummy access operations to increase the temperature of the memory device 130 will allow the memory system 110 to reduce the effects of temperature changes during idle modes and will increase reliability of the memory system while still allowing for reduced power consumption.

FIG. 2 illustrates an example of a system 200 that supports idle mode temperature control for memory systems in accordance with examples as disclosed herein. The system 200 may be an example of a system 100 as described with reference to FIG. 1, or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include one or more memory devices 240 to store data transferred between the memory system 210 and the host system 205 (e.g., in response to receiving access commands from the host system 205). The memory devices 240 may include one or more memory devices as described with reference to FIG. 1. For example, the memory devices 240 may include NAND memory, PCM, self-selecting memory, 3D cross point or other chalcogenide-based memories, FERAM, MRAM, NOR (e.g., NOR flash) memory, STT-MRAM, CBRAM, RRAM, or OxRAM, among other examples.

The memory system 210 may include a storage controller 230 for controlling the passing of data directly to and from the memory devices 240 (e.g., for storing data, for retrieving data, for determining memory locations in which to store data and from which to retrieve data). The storage controller 230 may communicate with memory devices 240 directly or via a bus (not shown), which may include using a protocol specific to each type of memory device 240. In some cases, a single storage controller 230 may be used to control multiple memory devices 240 of the same or different types. In some cases, the memory system 210 may include multiple storage controllers 230 (e.g., a different storage controller 230 for each type of memory device 240). In some cases, a storage controller 230 may implement aspects of a local controller 135 as described with reference to FIG. 1.

The memory system 210 may include an interface 220 for communication with the host system 205, and a buffer 225 for temporary storage of data being transferred between the host system 205 and the memory devices 240. The interface 220, buffer 225, and storage controller 230 may support translating data between the host system 205 and the memory devices 240 (e.g., as shown by a data path 250), and may be collectively referred to as data path components.

Using the buffer 225 to temporarily store data during transfers may allow data to be buffered while commands are being processed, which may reduce latency between commands and may support arbitrary data sizes associated with commands. This may also allow bursts of commands to be handled, and the buffered data may be stored, or transmitted, or both (e.g., after a burst has stopped). The buffer 225 may include relatively fast memory (e.g., some types of volatile memory, such as SRAM or DRAM), or hardware accelerators, or both to allow fast storage and retrieval of data to and from the buffer 225. The buffer 225 may include data path switching components for bi-directional data transfer between the buffer 225 and other components.

A temporary storage of data within a buffer 225 may refer to the storage of data in the buffer 225 during the execution of access commands. For example, after completion of an access command, the associated data may no longer be maintained in the buffer 225 (e.g., may be overwritten with data for additional access commands). In some examples, the buffer 225 may be a non-cache buffer. For example, data may not be read directly from the buffer 225 by the host system 205. In some examples, read commands may be added to a queue without an operation to match the address to addresses already in the buffer 225 (e.g., without a cache address match or lookup operation).

The memory system 210 also may include a memory system controller 215 for executing the commands received from the host system 205, which may include controlling the data path components for the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, a storage queue 270) may be used to control the processing of access commands and the movement of corresponding data. This may be beneficial, for example, if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if implemented, may be positioned anywhere within the memory system 210.

Data transferred between the host system 205 and the memory devices 240 may be conveyed along a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220 (e.g., according to a protocol, such as a UFS protocol or an eMMC protocol). Thus, the interface 220 may be considered a front end of the memory system 210. After receipt of each access command, the interface 220 may communicate the command to the memory system controller 215 (e.g., via the bus 235). In some cases, each command may be added to a command queue 260 by the interface 220 to communicate the command to the memory system controller 215.

The memory system controller 215 may determine that an access command has been received based on the communication from the interface 220. In some cases, the memory system controller 215 may determine the access command has been received by retrieving the command from the command queue 260. The command may be removed from the command queue 260 after it has been retrieved (e.g., by the memory system controller 215). In some cases, the memory system controller 215 may cause the interface 220 (e.g., via the bus 235) to remove the command from the command queue 260.

After a determination that an access command has been received, the memory system controller 215 may execute the access command. For a read command, this may include obtaining data from one or more memory devices 240 and transmitting the data to the host system 205. For a write command, this may include receiving data from the host system 205 and moving the data to one or more memory devices 240. In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may determine if the buffer 225 has sufficient available space to store the data associated with the command. For example, the memory system controller 215 may determine (e.g., via firmware, via controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. For example, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), which may be performed in accordance with a protocol (e.g., a UFS protocol, an eMMC protocol). As the interface 220 receives the data associated with the write command from the host system 205, the interface 220 may transfer the data to the buffer 225 for temporary storage using the data path 250. In some cases, the interface 220 may obtain (e.g., from the buffer 225, from the buffer queue 265) the location within the buffer 225 to store the data. The interface 220 may indicate to the memory system controller 215 (e.g., via the bus 235) if the data transfer to the buffer 225 has been completed.

After the write data has been stored in the buffer 225 by the interface 220, the data may be transferred out of the buffer 225 and stored in a memory device 240, which may involve operations of the storage controller 230. For example, the memory system controller 215 may cause the storage controller 230 to retrieve the data from the buffer 225 using the data path 250 and transfer the data to a memory device 240. The storage controller 230 may be considered a back end of the memory system 210. The storage controller 230 may indicate to the memory system controller 215 (e.g., via the bus 235) that the data transfer to one or more memory devices 240 has been completed.

In some cases, a storage queue 270 may support a transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain (e.g., from the buffer 225, from the buffer queue 265, from the storage queue 270) the location within the buffer 225 from which to obtain the data. The storage controller 230 may manage the locations within the memory devices 240 to store the data (e.g., performing wear-leveling, performing garbage collection). The entries may be added to the storage queue 270 (e.g., by the memory system controller 215). The entries may be removed from the storage queue 270 (e.g., by the storage controller 230, by the memory system controller 215) after completion of the transfer of the data.

To process a read command received from the host system 205, the memory system controller 215 may determine if the buffer 225 has sufficient available space to store the data associated with the command. For example, the memory system controller 215 may determine (e.g., via firmware, via controller firmware), an amount of space within the buffer 225 that may be available to store data associated with the read command.

In some cases, the buffer queue 265 may support buffer storage of data associated with read commands in a similar manner as discussed with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215 (e.g., via the bus 235) when the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain (e.g., from the buffer 225, from the storage queue 270) the location within one or more memory devices 240 from which to retrieve the data. In some cases, the storage controller 230 may obtain (e.g., from the buffer queue 265) the location within the buffer 225 to store the data. In some cases, the storage controller 230 may obtain (e.g., from the storage queue 270) the location within the buffer 225 to store the data. In some cases, the memory system controller 215 may move the command processed by the storage queue 270 back to the command queue 260.

Once the data has been stored in the buffer 225 by the storage controller 230, the data may be transferred from the buffer 225 and sent to the host system 205. For example, the memory system controller 215 may cause the interface 220 to retrieve the data from the buffer 225 using the data path 250 and transmit the data to the host system 205 (e.g., according to a protocol, such as a UFS protocol or an eMMC protocol). For example, the interface 220 may process the command from the command queue 260 and may indicate to the memory system controller 215 (e.g., via the bus 235) that the data transmission to the host system 205 has been completed.

The memory system controller 215 may execute received commands according to an order (e.g., a first-in-first-out order, according to the order of the command queue 260). For each command, the memory system controller 215 may cause data corresponding to the command to be moved into and out of the buffer 225, as discussed herein. As the data is moved into and stored within the buffer 225, the command may remain in the buffer queue 265. A command may be removed from the buffer queue 265 (e.g., by the memory system controller 215) if the processing of the command has been completed (e.g., if data corresponding to the access command has been transferred out of the buffer 225). If a command is removed from the buffer queue 265, the address previously storing the data associated with that command may be available to store data associated with a new command.

In some examples, the memory system controller 215 may be configured for operations associated with one or more memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. For example, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the described operations in conjunction with or instead of the memory system controller 215. In some cases, the memory system controller 215 may perform the functions of the storage controller 230 and the storage controller 230 may be omitted.

The memory system controller 215 may be configured to manage variations in threshold voltage distributions while the memory system 210 is active. However, the memory system 210 may enter an idle mode and temperature changes may result in voltage distribution shifts that may not be corrected while the memory system 210 is in the idle mode. In some cases, voltage distribution shifts may result in access operation errors (e.g., read errors) if the memory system 210 exits the idle mode. For example, a voltage distribution shift may cause threshold voltage distributions for different logic states to overlap, and a memory cell corresponding to one logic state may be read as a different logic state based on (e.g., as a result of) the voltage distribution overlap.

The memory system controller 215 may implement the use of dummy access commands, such as read commands, to reduce the effects of errors induced by temperature changes while the memory system 210 is in the idle mode. For example, performing an access command, such as a read command, may increase the temperature of the memory device 240 (e.g., as a result of an applied voltage) and allow the memory device 240 to maintain a desired operating temperature while the memory system 210 is in the idle mode. The memory system controller 215 may measure the temperature of the memory device 240 during the idle mode (e.g., periodically). If the memory system controller 215 determines that the temperature of the memory device 240 has fallen below a threshold temperature the memory system controller 215 may issue a quantity of dummy access commands (e.g., read commands) to the memory device 240, and the corresponding dummy access operations may result in a temperature increase at the memory device 240. In some cases, the quantity of dummy access operations may be based on (e.g., determined by) the temperature of the memory device 240, a rate of change of temperature of the memory device 240 compared to a previous temperature measurement, or any combination thereof. Performing dummy access operations to increase the temperature of the memory device 240 will allow the memory system 210 to reduce the effects of temperature changes during idle modes and will increase reliability of the memory system while still allowing for reduced power consumption.

Figure 3:
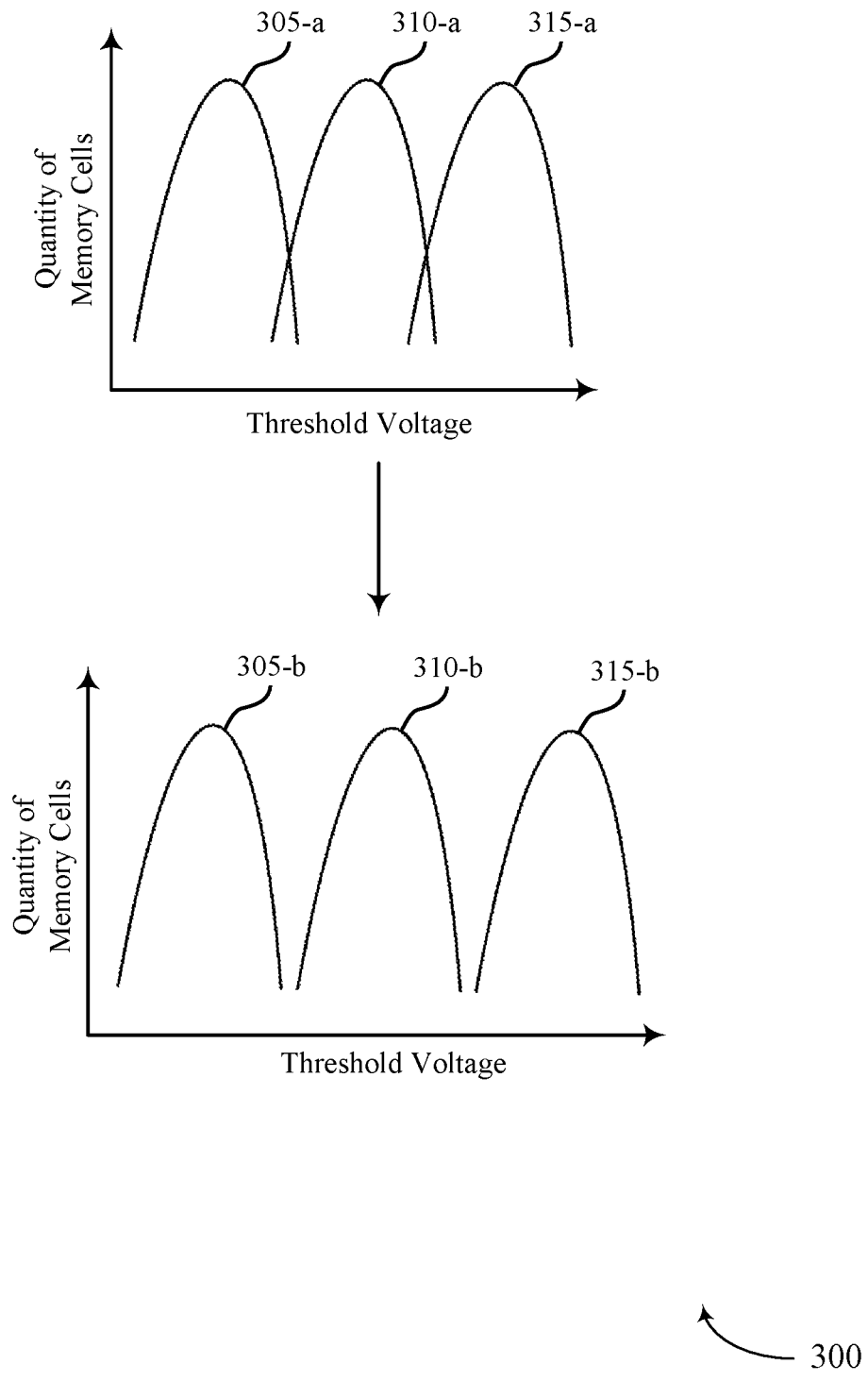
FIG. 3 illustrates an example of a voltage distribution diagram that supports idle mode temperature control for memory systems in accordance with examples as disclosed herein.

FIG. 3 illustrates an example of a voltage distribution diagram 300 that supports idle mode temperature control for memory systems in accordance with examples as disclosed herein. In some cases, a logic state stored by a memory cell (e.g., of a memory device of a memory system) may correspond to or be associated with a threshold voltage. For example, a first threshold voltage (e.g., a first voltage range) may correspond to a first logic state and a second threshold voltage (e.g., a second voltage range) may correspond to a second logic state, and so on. A threshold voltage distribution (e.g., one or more of the threshold voltage distributions 305, 310, and/or 315 shown in FIG. 3) may illustrate a quantity of memory cells associated with a respective logic state, as well as the different threshold voltage values associated with each of the memory cells storing the respective logic state. For example, a threshold voltage distribution may show, for each threshold voltage value associated with a respective logic state, a quantity of memory cells having the threshold voltage value.

In an example illustrated by FIG. 3, a threshold voltage distribution 305 may correspond to a first logic state associated with first a quantity of memory cells at a memory device, a threshold voltage distribution 310 may correspond to a second logic state associated with a second quantity of memory cells at the memory device, and a threshold voltage distribution 315 may correspond to a third logic state associated with a third quantity of memory cells at the memory device. While FIG. 3 illustrates three logic states, the techniques described herein may apply to any quantity of threshold voltage distributions (e.g., 2, 4, 5).

In some cases, a decrease, or other change, in temperature may be associated with an overlap in threshold voltage distributions (e.g., as shown in the upper example of FIG. 3). At a low temperature (e.g., a temperature lower than a threshold temperature) the threshold voltage distributions 305-*a*, 310-*a*, and 315-*a* may overlap as a result of changes in threshold voltages of respective memory cells of the threshold voltage distributions 305-*a*, 310-*a*, and 315-*a*. As a result of the overlap, a memory cell associated with the threshold voltage distribution 305-*a* (e.g., a memory cell having a threshold voltage corresponding to the right side of threshold voltage distribution 305-*a* where the overlap occurs) and therefore associated with the first logic state, may be read as the second logic state corresponding to threshold voltage distribution 310-*a* (e.g., corresponding to the left side of threshold voltage distribution 310-*a* where the overlap occurs). For example, because the memory cell has a threshold voltage that corresponds to both the threshold voltage distribution 305-*a* and the threshold voltage distribution 310-*a* (e.g., because of the overlap), the memory cell may be incorrectly read as storing the second logic state rather than the first logic state. The same example may also apply to overlap between the second and third logic states, or any other possible overlapping logic states. Therefore, the overlap of the threshold voltage distributions may result in access operation errors (e.g., read errors, bit errors) that may decrease the reliability of the associated memory system.

In some cases, a memory system may be configured to manage variations in threshold voltage distributions while the memory system is active (e.g., powered on, in an active mode such as a non-standby mode). However, if the memory system is in an idle mode (e.g., a powered down mode, a standby mode), temperature changes (e.g., reduced temperatures) may result in threshold voltage distribution shifts (e.g., the overlapping of threshold voltage distributions 305-*a*, 310-*a*, and 315-*a*) that may not be corrected by the memory system and therefore affect the accuracy of access operations such as read operations.

The present disclosure provides techniques to reduce or mitigate threshold voltage distribution shifts while in an idle mode. For example, while in an idle mode, the memory system may increase the temperature of one or more memory devices by performing access operations, such as read operations, at the one or more memory devices. The access operations may be dummy access operations, or operations that may be performed to increase the temperature of the memory device(s) rather than to read or write data to a memory cell in response to a command from a host system. By increasing the temperature of the memory device(s), the memory system may avoid or reduce threshold voltage distribution overlap. For example, at a low temperature (e.g., as illustrated in the upper example of FIG. 3), such as a temperature below a threshold temperature, threshold voltage distribution 305-*a*, threshold voltage distribution 310-*a*, and threshold voltage distribution 315-*a* may overlap. However, at a higher temperature which may be a result of the dummy access operations (e.g., as illustrated by the lower example of FIG. 3), such as a temperature above the threshold temperature, threshold voltage distribution 305-*b*, threshold voltage distribution 310-*b*, and threshold voltage distribution 315-*b* may not overlap. Because threshold voltage distribution 305-*b*, threshold voltage distribution 310-*b*, and threshold voltage distribution 315-*b* may not overlap, access operations (e.g., read operations) performed at the memory device (e.g., after exiting the idle mode) may return an accurate logic state of one or more memory cells (e.g., may reduce read error, bit error), increasing device accuracy and reliability.

If the memory system is in the idle mode (e.g., a low power mode, or a powered off state), the memory system may maintain a temperature of the memory device(s) or change a temperature of the memory device(s), such that threshold voltage distributions may not overlap. For example, the memory system may maintain or change a temperature such that threshold voltage distributions 305-*b*, 310-*b*, and 315-*b* may not overlap, such as by determining (e.g., measuring) a respective temperature of each of the memory device(s) and determining whether the respective temperature of each the memory device(s) is lower than a threshold temperature. If the respective temperature of a memory device is lower than the threshold temperature, the memory system may transmit one or more dummy access commands (e.g., dummy read commands) to the memory device (e.g., among other memory devices having a temperature lower than the threshold temperature). The memory device may perform one or more dummy access operations in response to the dummy access commands, which may increase the temperature of the memory device to avoid or reduce threshold voltage distribution overlap. By reducing or avoiding the overlap, an error rate (e.g., bit error rate) for access operations (e.g., read operations) performed at the memory device (e.g., after exiting the idle mode) may be reduced.

Figure 4:
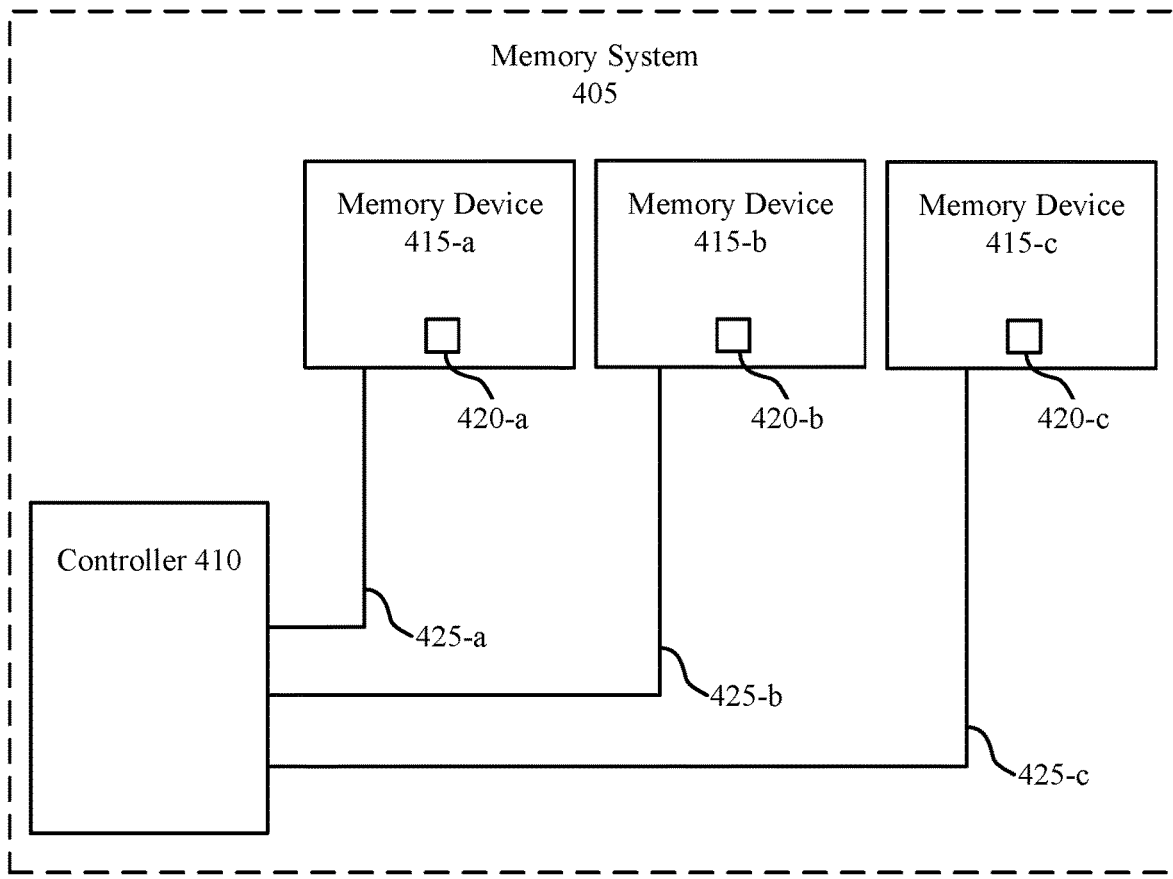
FIG. 4 illustrates an example of a system diagram that supports idle mode temperature control for memory systems in accordance with examples as disclosed herein.

FIG. 4 illustrates an example of a system diagram 400 that supports idle mode temperature control for memory systems in accordance with examples as disclosed herein. The system diagram 400 may include a memory system 405, which may be an example of the memory system 110 described with reference to FIG. 1, the memory system 210 described with reference to FIG. 2, or both. The memory system 405 may include a controller 410, which may be an example of the memory system controller 115 as described with reference to FIG. 1, the memory system controller 215 as described with reference to FIG. 2, or both. The memory system 405 may also include one or more memory devices 415, which may be examples of the memory device 130 described with reference to FIG. 1, the memory device 240 as described with reference to FIG. 2, or both. Although the system diagram 400 shows three memory devices 415 (e.g., memory device 415-*a*, memory device 415-*b*, and memory device 415-*c*), any quantity of memory devices 415 may be included (e.g., 1, 2, 5).

The controller 410 may be configured to manage variations in threshold voltage distributions (e.g., changes in threshold voltages of memory cells) while the memory system 405 is active. However, temperature changes may result in voltage distribution overlap that may not be corrected while the memory system 405 is in an idle mode, which may result in access operation errors (e.g., read errors) if the memory system 405 exits the idle mode. As described with reference to FIG. 3, the controller 410 may issue dummy access commands, such as dummy read commands, to reduce the effects of read errors induced by threshold voltage distribution overlap from temperature changes while the memory system 405 is in the idle mode.

If the memory system 405 enters an idle state, after a time period (e.g., based on an elapsed duration, indicated by a timer) the controller 410 may transmit a respective command via a corresponding connection 425 (e.g., a bus, channel, electrode line, electrical connection) between the controller 410 and each memory device 415. In some cases, the memory system 405 may receive an indication of the time period or duration from a host system. The command may indicate for the respective memory device 415 to perform a temperature measurement (e.g., using a temperature component 420) and report the temperature measurement to the controller 410. Each memory device 415 may include a respective temperature component 420 which may be used to measure the corresponding temperature of the memory device 415 (e.g., a junction temperature).

The controller 410 may determine whether the respective temperature of each memory device 415 is lower than a threshold temperature. If the temperature of any memory device 415 is lower than the threshold temperature, the controller 410 may switch to a high performance state and may initiate dummy access operations (e.g., transmit dummy access commands), such as dummy read operations or dummy write operations, at the corresponding memory device 415 via the respective connection 425 and while the memory system 405 is in the idle mode. The dummy access operations may be configured to increase the temperature of the memory device 415 (e.g., as a result of one or more applied voltages or other actions related to the access operations). In some cases, the power consumption of the high power state of the controller 410 may also be associated with an increase in temperature of the memory system 405 and one or more associated memory devices 415.

In some cases, each memory device 415 may be associated with a different temperature. For example, the temperature measured by temperature component 420-a corresponding to memory device 415-a may be different from (e.g., lower than) the temperature measured by the temperature component 420-b corresponding to memory device 415-b, which may be different from (e.g., lower than) the temperature measured by temperature component 420-c corresponding to memory device 415-c. In such an example, the controller 410 may issue a first quantity of dummy access commands to the memory device 415-a and may issue a second quantity of dummy access commands greater than the first quantity to the memory device 415-b. In some cases, the controller 410 may issue no dummy access commands to the memory device 415-c if, for example, the temperature measured by temperature component 420-c is above the threshold temperature.

In some cases, the quantity of dummy access operations performed may depend on the respective temperature of a memory device 415. For example, a lower temperature (e.g., farther from the threshold temperature) may be associated with a greater quantity of dummy access commands. In some cases, the controller 410 may determine a quantity of dummy access operations based on (e.g., determined by) a difference between the threshold temperature and the temperature of the memory device 415.

In some cases, the threshold temperature may be based on, or may be, a difference between a respective measured temperature at a corresponding memory device 415 and a lowest permitted operating temperature for the memory system 405 (e.g., a minimum temperature in an allowable range for the memory system 405), a temperature at which threshold voltage distributions overlap, a previous operating temperature of the memory system 405, or any combination thereof. In some cases, the threshold temperature may be a dynamically configured value which may depend on the temperature history of the memory device 415, which may include one or more previous operating temperatures of the memory device 415. In some cases, the threshold temperature may be the same for memory devices 415-a, 415-b, and 415-c. In some cases, the threshold temperature may be respectively configured (e.g., may be different) for each memory device 415.

In some cases, the threshold temperature may be based on or related to a temperature difference between at least one of the previous operating temperatures and a threshold operating temperature (e.g., the lowest allowed operating temperature) of a respective memory device 415. In some cases, the threshold temperature may be higher if temperature conditions of the memory device 415 are low on average, because reheating the memory device 415 to a safe temperature may take longer. In another example, the threshold temperature may be lower if the temperature conditions of the memory device 415 are on average high (e.g., because reheating the memory device 415 to a safe temperature may take less long).

In some cases (e.g., as a result of a capability of the memory system 405 and the controller 410), the controller 410 may transmit dummy access commands via connections 425 in parallel (e.g., transmissions that at least partially overlap in time). For example, the controller 410 may transmit dummy access commands to memory device 415-a via connection 425-a, to memory device 415-b via connection 425-b, and to memory device 415-c via connection 425-c in parallel. Although the quantities of dummy access commands may differ between each memory device 415, the controller 410 may still transmit the dummy access commands in parallel. In some cases (e.g., as a result of a capability of the memory system 405 and the controller 410), the controller 410 may transmit the dummy access commands in series. For example, the controller 410 may transmit a first quantity of dummy access operations via connection 425-a to the memory device 415-a, followed by a second quantity of dummy access operations via connection 425-b to the memory device 415-b, followed by a third quantity of dummy access operations via connection 425-c to the memory device 415-c, which may not overlap in time. In some cases, whether the controller 410 transmits the dummy access operations in parallel or in series may depend on capabilities of the memory devices 415. Similarly, the controller 410 may transmit temperature measurement commands via connections 425 in parallel, in series, or any combination thereof.

In some cases, the dummy access operations may be performed on data pages or virtual blocks which reading may not effect. For example, the dummy access operations (e.g., read operations) may be performed at one or more non-allocated virtual blocks, one or more virtual blocks that are flagged for erasing, or any combination thereof, at a respective memory device 415. In some cases, the access operations may be spread across different virtual blocks of the memory device 415.

After a second time period (e.g., after a second duration between the first temperature measurement has elapsed), and while the memory system 405 remains in idle mode, the controller 410 may once again measure the temperatures of the memory devices 415. The controller 410 may determine whether the temperature of each memory device 415 is lower than the threshold temperature, and may determine whether to perform a respective second set (e.g., quantity) of dummy access operations at each memory device 415. In some cases, in response to the first set of dummy access operations, the temperature of one or more memory devices 415 may have changed. For example, the temperature of the memory device 415-b may have change to no longer be below the threshold temperature, and the controller may not issue any dummy access commands to the memory device 415-b. In another example, the temperature of the memory device 415-a may have increased, decreased, or stayed the same, and may still be below the threshold temperature. Accordingly, the controller 410 may issue a quantity of dummy access commands to the memory device 415-a (e.g., a quantity determined by the temperature of the memory device 415-a).

In some cases, the duration between temperature measurements may be based on, or may be relative to, the rate of change of temperature of one or more memory devices 415 in response to performing the dummy access operations. For example, if the rate of change of temperature of a memory device 415 does not satisfy a rate of change of temperature threshold (e.g., there is no change in temperature), the controller 410 may decrease the duration between temperature measurements. In some cases, the memory system 405 may receive an indication (e.g., from a host system) of the duration between temperature measurements from the host system. In some cases, the memory device 415 may determine the duration between temperature measurements. In some cases, the quantity of dummy access operations may be based on, or may be relative to, the rate of change of temperature of a memory device 415 in response to performing the dummy access operations. For example, if the rate of change of temperature of the memory device 415 is not sufficient (e.g., does not satisfy a rate of change of temperature threshold), the controller 410 may increase the respective quantity of dummy access operations.

In some cases, the controller 410 may continue to periodically measure the temperature of the memory devices 415 until the memory system 405 exits the idle mode. For example, if the measured temperature of a respective memory device 415 remains below the threshold temperature, the controller 410 may continue to measure the temperature of the memory device 415 at consecutive time intervals and to issue respective dummy access commands. In another example, if the measured temperature is above the threshold temperature, the controller 410 may refrain from issuing dummy access commands to the memory device 415, but may continue to measure the temperature of the memory device 415 in case the temperature once again falls below the threshold. In the example where the measured temperature is above the threshold, the time between temperature measurements may be larger than the time intervals following a measured temperature below the threshold. For example, the time interval following a measured temperature below the threshold may be shorter in order for the controller 410 to verify that the temperature of the memory device 415 is increasing, or to transmit more dummy access commands. Additionally or alternatively, the time interval following a measured temperature above the threshold temperature may be longer to conserve power, and because no dummy access operations may be performed.

Figure 5:
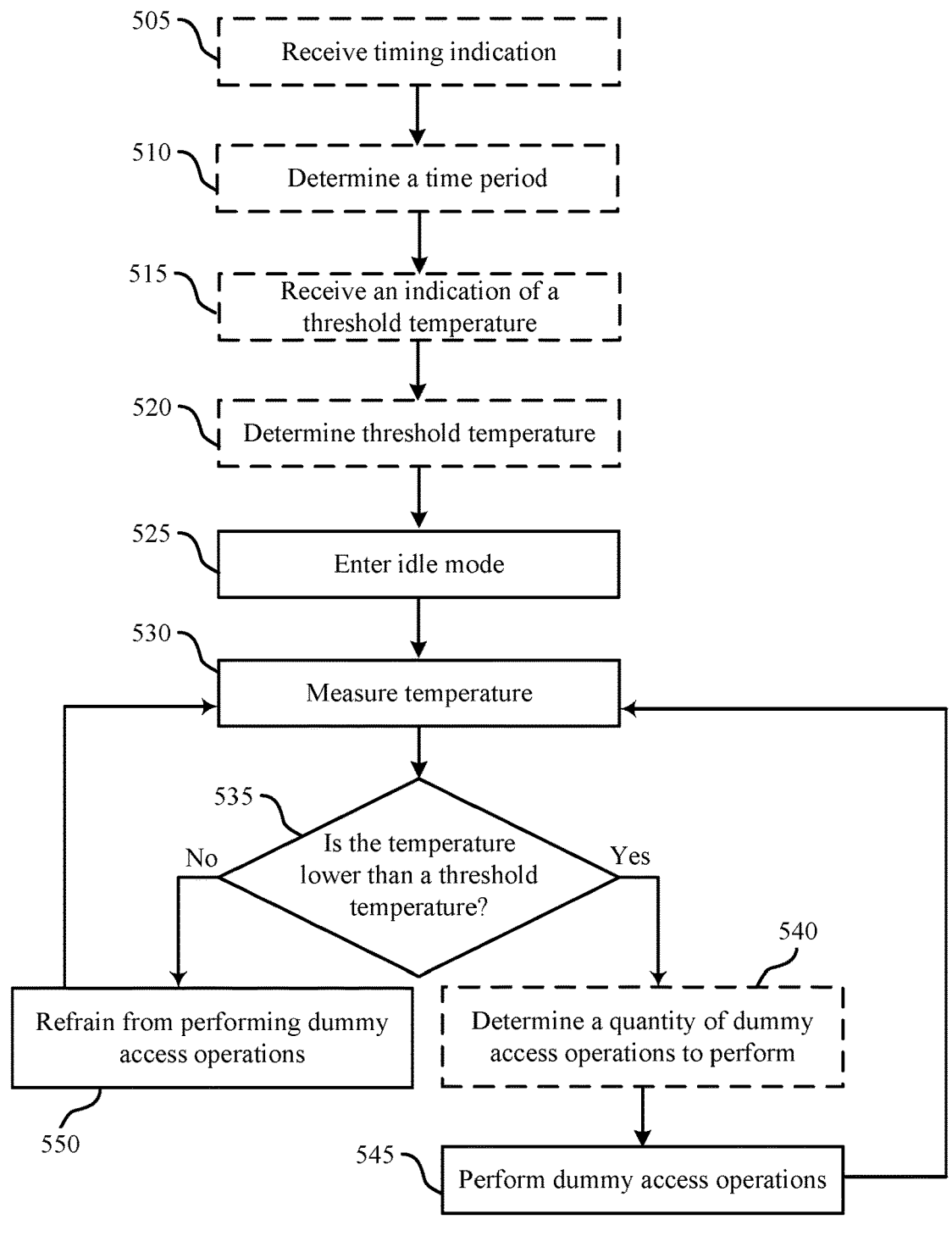
FIG. 5 illustrates an example of a process flow that supports idle mode temperature control for memory systems in accordance with examples as disclosed herein.

FIG. 5 illustrates an example of a process flow 500 that supports idle mode temperature control for memory systems in accordance with examples as disclosed herein. In some examples, process flow 500 may be implemented by one or more aspects of systems 100 or 200, or system diagram 400. For instance, process flow 500 may be implemented by a memory system 110 as described with reference to FIG. 1, or a memory system 210 as described with reference to FIG. 2, or a memory system 405 as described with reference to FIG. 4, or some combination thereof. Aspects of the process flow 500 may be implemented by a controller (e.g., a controller 410), among other components. Additionally, or alternatively, aspects of the process flow 500 may be implemented as instructions stored in memory (e.g., firmware stored in a memory coupled with a controller), may cause the controller to perform the operations of the process flow 500. For example, the instructions, when executed by a controller (e.g., the controller 410), may cause the controller to perform the operations of the process flow 500. In some cases, elements of the process flow 500 may be performed in a different order, and elements may be added to the process flow 500 or omitted from the process flow 500.

In some cases, at 505, a timing indication may be received. For example, the memory system may receive the timing indication from a host system. The timing indication may be an indication of a duration between entering an idle mode and performing one or more operations (e.g., performing one or more temperature measurements) at a first time. For example, the duration may be a first duration between the first time and entering the idle mode at a previous time before the first time.

In some cases, at 510, a time period, or a duration, may be determined. For example, the memory system may determine the duration. In some cases, the duration may be determined after the memory system enters an idle mode (e.g., at 525). The duration may be the first duration between entering the idle mode and the first time at which the one or more operations (e.g., temperature measurements) are performed. In some cases, the memory system may determine the duration based on, or according to, the indication of the duration from the host system. In some cases, the memory system may determine the duration based on (e.g., using) information from) a configuration, or a previous determination by the memory system.

In some cases, at 515, an indication of a threshold temperature may be received. For example, the memory system may receive the indication of the threshold temperature from the host system. The threshold temperature may be a threshold temperature as described with reference to FIG. 4.

In some cases, at 520, a threshold temperature may be determined. For example, the memory system may determine the threshold temperature. In some cases, the memory system may determine the threshold temperature after entering an idle mode (e.g., at 525). In some cases, the memory system may determine the threshold temperature based on, or according to, the indication of the threshold temperature received from the host system at 515. In some cases, the memory system may determine the threshold temperature based on (e.g., determined by) a temperature history of a memory device, as described with reference to FIG. 4. In some cases, the memory system may determine the threshold temperature based on (e.g., using) a temperature at which a first threshold voltage distribution associated with a first logic state overlaps with a second threshold voltage distribution associated with a second logic state, as described with reference to FIGS. 3 and 4.

At 525, the memory system may enter an idle mode. For example, the memory system may be powered off, or may enter a power saving mode (e.g., a standby mode). In some examples, the memory system may receive a command from the host system to enter the idle mode. In other examples, the memory system may determine to enter the idle mode.

At 530, a temperature of a memory device of the memory system may be measured. For example, the memory system may measure the temperature of the memory device (e.g., may issue one or more commands to the memory device to measure the temperature), as described with reference to FIG. 4. In some cases, the memory system may measure the temperature of a quantity of memory devices (e.g., any quantity of memory devices), in parallel or in series. The memory system may measure the temperature of the memory device at the first time, which may be after the first duration following the memory system entering the idle mode at 525.

At 535, the memory system may determine whether the temperature of the memory device at the first time is lower than the threshold temperature.

In some cases, at 540, a quantity of dummy access operations may be determined. For example, in response to determining that the temperature of the memory device at the first time is lower than the threshold temperature, the memory system may determine a quantity of dummy access operations for the memory device to perform. In some cases, the memory system may determine the quantity of dummy access operations based on, or according to, a difference between the threshold temperature and the temperature of the memory device (e.g., at the first time). In some cases, the memory system may receive an indication of the quantity of dummy access operations from the host system. For example, the memory system may receive an indication of a list or a table (e.g., stored at the memory system, received from the host system) that indicates temperatures or temperature differences (e.g., relative to the threshold temperature) and corresponding quantities of dummy access operations.

At 545, the memory system may perform one or more (e.g., the determined quantity of) dummy access operations at the memory device. In some cases, the dummy access operations may be performed periodically, or back-to-back, within a second duration following the first time.

In some cases, the memory system may determine that the temperature of the memory device at the first time is greater than the temperature threshold, and at 550 the memory system may refrain from performing dummy access operations. In such cases, at a second time, the memory system may return to 530 and may measure the temperature of the memory device after a second time duration (e.g., as described with reference to FIG. 4).

Alternatively, the memory system may once again measure the temperature of the memory device at the second time after performing the dummy access operations. For example, the memory system may return to 530 after performing the dummy access operations at 545, and may measure the temperature of the memory device at the second time, which may be a time based on, or directly following, the second duration from the first time. In some cases, the memory system may determine the duration of the second duration based on, or according to, a rate of change of the temperature of the memory device in response to performing the one or more dummy access operations. For example, performing the dummy access operations may be associated with an increase in temperature, and based on (e.g., using, according to) the rate of temperature increase at the memory device, the memory system may determine the second time duration. In some cases, the memory system may receive an indication of the second duration from the host system. In some cases, the first duration and the second duration may be the same, while in some cases the first duration and the second duration may be different.

Based on, or in response to, measuring the temperature of the memory device at the second time, the memory system may determine whether the temperature of the memory device at the second time is lower than the threshold temperature (e.g., at 535). The memory system may determine whether to perform a second set of one or more (e.g., a second quantity) of dummy access operations at the memory device while the memory system is in the idle mode. For example, the memory system may determine that the temperature of the memory device at the second time is lower than the threshold temperature, and may determine to perform the second quantity of dummy access operations based on (e.g., as a result of) the determination. In some cases, the second quantity of dummy access operations and the first quantity of dummy access operations may be different. In some other cases, the second quantity of dummy access operations and the first quantity of dummy access operations may be the same. In another example, the memory system may determine that the temperature of the memory device at the second time is greater than the threshold temperature. In such an example, at 550, the memory system may determine to refrain from performing dummy access operations.

The memory system may continue to measure the temperature of the memory device after consecutive durations and determine whether to perform dummy access operations until the memory system exits the idle mode. In some cases, the memory system may perform the process flow 500 with multiple memory devices, as described with reference to FIG. 4. In some cases, the memory system may perform the process flow 500 with the multiple memory devices in parallel, while in other cases the memory system may perform the process flow 500 with the multiple memory devices in series.

Figure 6:
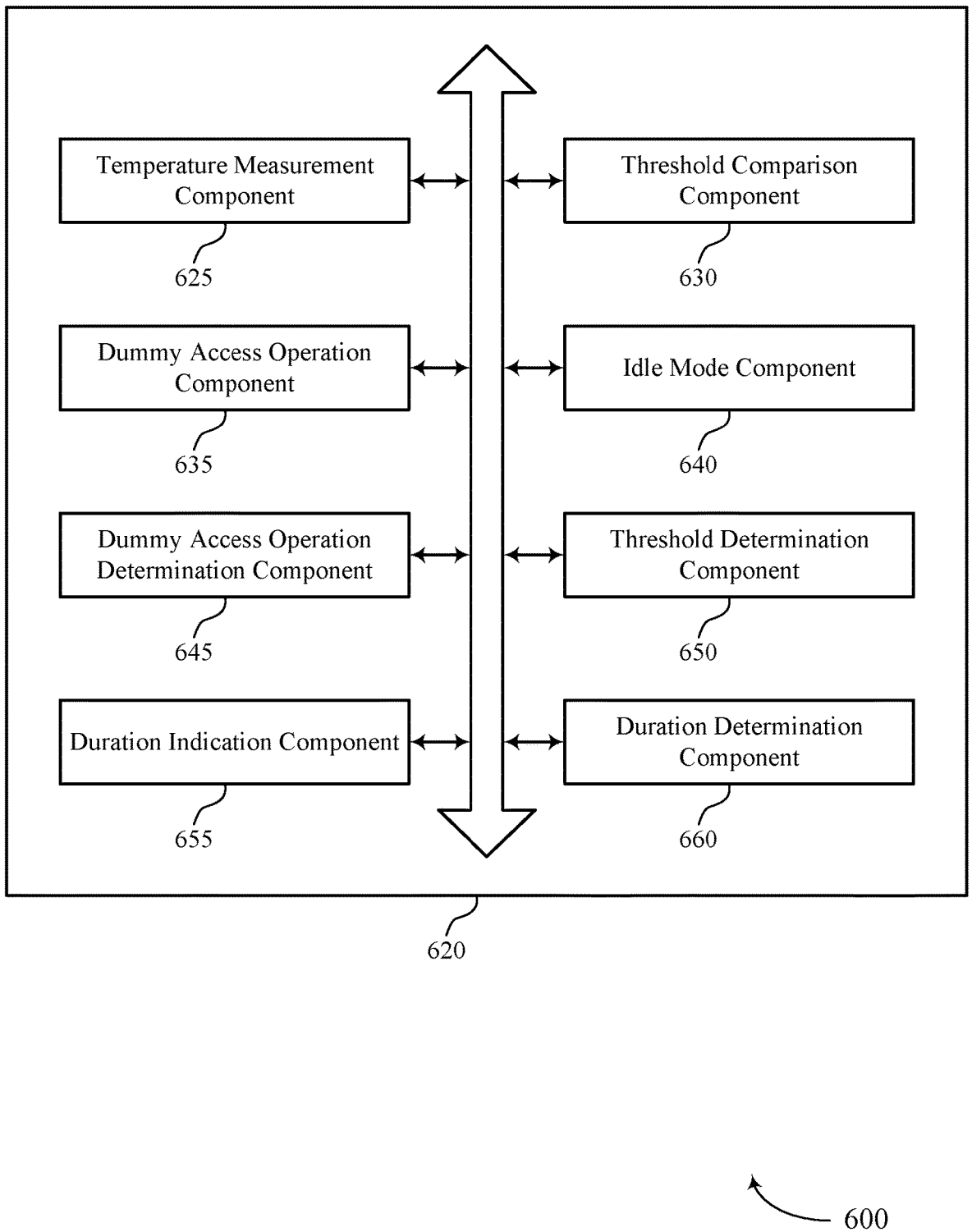
FIG. 6 shows a block diagram of a Memory System that supports idle mode temperature control for memory systems in accordance with examples as disclosed herein.

FIG. 6 shows a block diagram 600 of a Memory System 620 that supports idle mode temperature control for memory systems in accordance with examples as disclosed herein. The Memory System 620 may be an example of aspects of a Memory System as described with reference to FIGS. 1 through 5. The Memory System 620, or various components thereof, may be an example of means for performing various aspects of idle mode temperature control for memory systems as described herein. For example, the Memory System 620 may include a temperature measurement component 625, a threshold comparison component 630, a dummy access operation component 635, an idle mode component 640, a dummy access operation determination component 645, a threshold determination component 650, a duration indication component 655, a duration determination component 660, or any combination thereof. Each of these components may communicate, directly or indirectly, with one another (e.g., via one or more buses).

The temperature measurement component 625 may be configured as or otherwise support a means for measuring, at a memory system while in an idle mode, a temperature of a memory device of the memory system at a first time. The threshold comparison component 630 may be configured as or otherwise support a means for determining whether the temperature of the memory device at the first time is lower than a threshold temperature. The dummy access operation component 635 may be configured as or otherwise support a means for performing, while in the idle mode, one or more dummy access operations at the memory device based at least in part on determining that the temperature at the first time is lower than the threshold temperature.

In some examples, performing the one or more dummy access operations is configured to increase the temperature of the memory device.

In some examples, the idle mode component 640 may be configured as or otherwise support a means for entering the idle mode at a previous time before the first time, where measuring the temperature of the memory device at the first time is based at least in part on a first duration elapsing between the previous time and the first time.

In some examples, the duration indication component 655 may be configured as or otherwise support a means for receiving, from a host system, an indication of a duration of the first duration.

In some examples, the temperature measurement component 625 may be configured as or otherwise support a means for measuring, while in the idle mode, the temperature of the memory device at a second time based at least in part on a second duration elapsing between the first time and the second time. In some examples, the threshold comparison component 630 may be configured as or otherwise support a means for determining whether the temperature of the memory device at the second time is lower than the threshold temperature. In some examples, the dummy access operation component 635 may be configured as or otherwise support a means for determining whether to perform a second one or more dummy access operations at the memory device while in the idle mode based at least in part on determining whether the temperature at the second time is lower than the threshold temperature.

In some examples, the threshold comparison component 630 may be configured as or otherwise support a means for determining that the temperature of the memory device at the second time is greater than the threshold temperature. In some examples, the dummy access operation component 635 may be configured as or otherwise support a means for determining to refrain from performing the second one or more dummy access operations based at least in part on determining that the temperature of the memory device at the second time is greater than the threshold temperature.

In some examples, the threshold comparison component 630 may be configured as or otherwise support a means for determining that the temperature of the memory device at the second time is lower than the threshold temperature. In some examples, the dummy access operation component 635 may be configured as or otherwise support a means for determining to perform the second one or more dummy access operations based at least in part on determining that the temperature of the memory device at the second time is lower than the threshold temperature.

In some examples, the duration determination component 660 may be configured as or otherwise support a means for determining a duration for the second duration based at least in part on a rate of change of the temperature of the memory device in response to performing the one or more dummy access operations.

In some examples, the duration indication component 655 may be configured as or otherwise support a means for receiving, from a host system, an indication of the second duration.

In some examples, the temperature measurement component 625 may be configured as or otherwise support a means for measuring, at the memory system while in the idle mode, a temperature of a second memory device of the memory system at the first time. In some examples, the threshold comparison component 630 may be configured as or otherwise support a means for determining whether the temperature of the second memory device at the first time is lower than the threshold temperature. In some examples, the dummy access operation component 635 may be configured as or otherwise support a means for performing, while in the idle mode, one or more dummy access operations at the second memory device based at least in part on determining that the temperature of the second memory device at the first time is lower than the threshold temperature.

In some examples, the dummy access operation determination component 645 may be configured as or otherwise support a means for determining a quantity of the one or more dummy access operations based at least in part on a difference between the threshold temperature and the temperature of the memory device at the first time.

In some examples, the threshold determination component 650 may be configured as or otherwise support a means for determining the threshold temperature based at least in part on a temperature history of the memory device including one or more previous operating temperatures of the memory device.

In some examples, the threshold determination component 650 may be configured as or otherwise support a means for determining the threshold temperature based at least in part on a temperature difference between at least one of the one or more previous operating temperatures and a threshold operating temperature of the memory device.

In some examples, the threshold temperature is based at least in part on a first temperature at which a first threshold voltage distribution associated with a first logic state overlaps with a second threshold voltage distribution associated with a second logic state.

In some examples, the one or more dummy access operations includes one or more dummy read operations.

In some examples, the one or more dummy read operations are performed at one or more non-allocated virtual blocks, one or more virtual blocks that are flagged for erasing, or any combination thereof.

Figure 7:
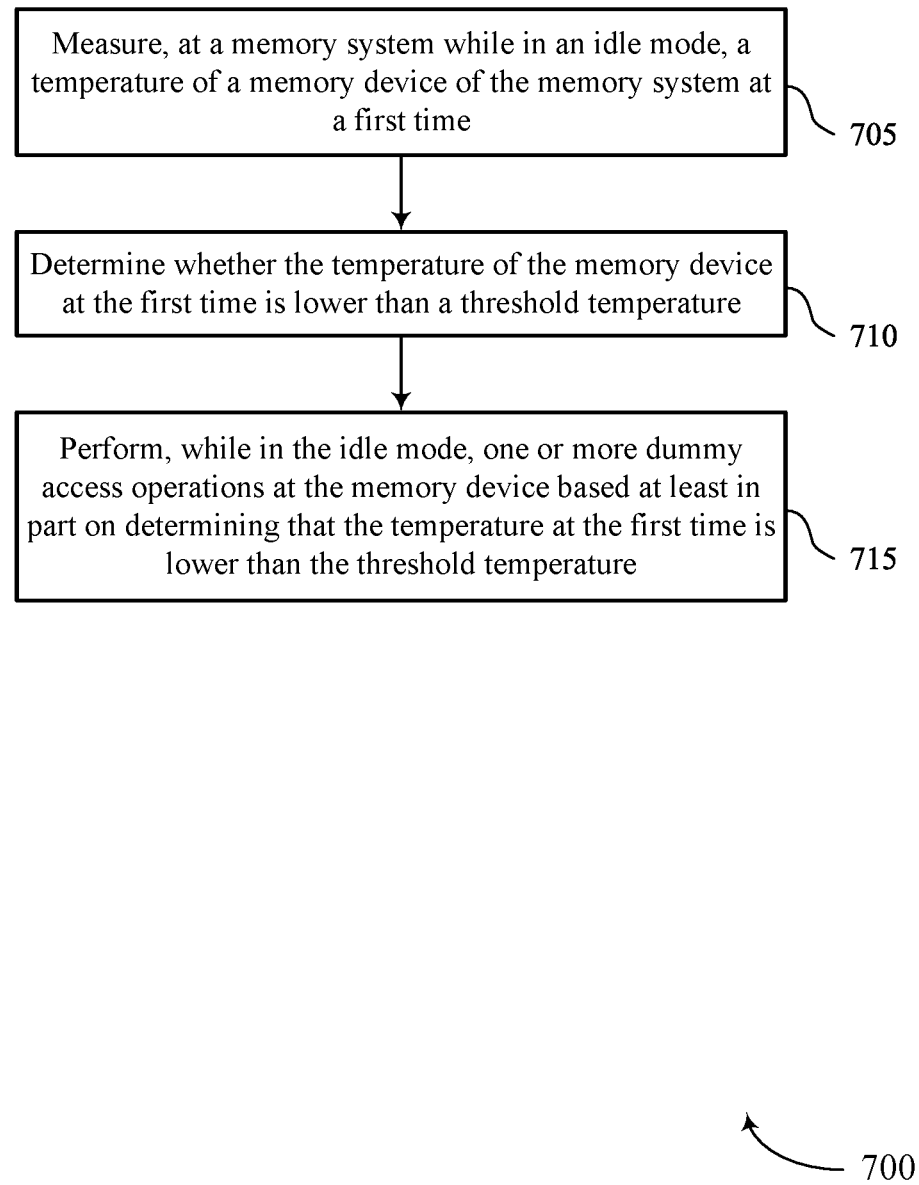
FIG. 7 shows a flowchart illustrating a method or methods that support idle mode temperature control for memory systems in accordance with examples as disclosed herein.

FIG. 7 shows a flowchart illustrating a method 700 that supports idle mode temperature control for memory systems in accordance with examples as disclosed herein. The operations of method 700 may be implemented by a Memory System or its components as described herein. For example, the operations of method 700 may be performed by a Memory System as described with reference to FIGS. 1 through 6. In some examples, a Memory System may execute a set of instructions to control the functional elements of the device to perform the described functions. Additionally, or alternatively, the Memory System may perform aspects of the described functions using special-purpose hardware.

At 705, the method may include measuring, at a memory system while in an idle mode, a temperature of a memory device of the memory system at a first time. The operations of 705 may be performed in accordance with examples as disclosed herein. In some examples, aspects of the operations of 705 may be performed by a temperature measurement component 625 as described with reference to FIG. 6.

At 710, the method may include determining whether the temperature of the memory device at the first time is lower than a threshold temperature. The operations of 710 may be performed in accordance with examples as disclosed herein. In some examples, aspects of the operations of 710 may be performed by a threshold comparison component 630 as described with reference to FIG. 6.

At 715, the method may include performing, while in the idle mode, one or more dummy access operations at the memory device based at least in part on determining that the temperature at the first time is lower than the threshold temperature. The operations of 715 may be performed in accordance with examples as disclosed herein. In some examples, aspects of the operations of 715 may be performed by a dummy access operation component 635 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for measuring, at a memory system while in an idle mode, a temperature of a memory device of the memory system at a first time; determining whether the temperature of the memory device at the first time is lower than a threshold temperature; and performing, while in the idle mode, one or more dummy access operations at the memory device based at least in part on determining that the temperature at the first time is lower than the threshold temperature.

Aspect 2: The method, apparatus, or non-transitory computer-readable medium of aspect 1, where performing the one or more dummy access operations is configured to increase the temperature of the memory device.

Aspect 3: The method, apparatus, or non-transitory computer-readable medium of any of aspects 1 through 2, further including operations, features, circuitry, logic, means, or instructions, or any combination thereof for entering the idle mode at a previous time before the first time, where measuring the temperature of the memory device at the first time is based at least in part on a first duration elapsing between the previous time and the first time.

Aspect 4: The method, apparatus, or non-transitory computer-readable medium of aspect 3, further including operations, features, circuitry, logic, means, or instructions, or any combination thereof for receiving, from a host system, an indication of a duration of the first duration.

Aspect 5: The method, apparatus, or non-transitory computer-readable medium of any of aspects 1 through 4, further including operations, features, circuitry, logic, means, or instructions, or any combination thereof for measuring, while in the idle mode, the temperature of the memory device at a second time based at least in part on a second duration elapsing between the first time and the second time; determining whether the temperature of the memory device at the second time is lower than the threshold temperature; and determining whether to perform a second one or more dummy access operations at the memory device while in the idle mode based at least in part on determining whether the temperature at the second time is lower than the threshold temperature.

Aspect 6: The method, apparatus, or non-transitory computer-readable medium of aspect 5, further including operations, features, circuitry, logic, means, or instructions, or any combination thereof for determining that the temperature of the memory device at the second time is greater than the threshold temperature and determining to refrain from performing the second one or more dummy access operations based at least in part on determining that the temperature of the memory device at the second time is greater than the threshold temperature.

Aspect 7: The method, apparatus, or non-transitory computer-readable medium of any of aspects 5 through 6, further including operations, features, circuitry, logic, means, or instructions, or any combination thereof for determining that the temperature of the memory device at the second time is lower than the threshold temperature and determining to perform the second one or more dummy access operations based at least in part on determining that the temperature of the memory device at the second time is lower than the threshold temperature.

Aspect 8: The method, apparatus, or non-transitory computer-readable medium of any of aspects 5 through 7, further including operations, features, circuitry, logic, means, or instructions, or any combination thereof for determining a duration for the second duration based at least in part on a rate of change of the temperature of the memory device in response to performing the one or more dummy access operations.

Aspect 9: The method, apparatus, or non-transitory computer-readable medium of any of aspects 5 through 8, further including operations, features, circuitry, logic, means, or instructions, or any combination thereof for receiving, from a host system, an indication of the second duration.

Aspect 10: The method, apparatus, or non-transitory computer-readable medium of any of aspects 1 through 9, further including operations, features, circuitry, logic, means, or instructions, or any combination thereof for measuring, at the memory system while in the idle mode, a temperature of a second memory device of the memory system at the first time; determining whether the temperature of the second memory device at the first time is lower than the threshold temperature; and performing, while in the idle mode, one or more dummy access operations at the second memory device based at least in part on determining that the temperature of the second memory device at the first time is lower than the threshold temperature.

Aspect 11: The method, apparatus, or non-transitory computer-readable medium of any of aspects 1 through 10, further including operations, features, circuitry, logic, means, or instructions, or any combination thereof for determining a quantity of the one or more dummy access operations based at least in part on a difference between the threshold temperature and the temperature of the memory device at the first time.

Aspect 12: The method, apparatus, or non-transitory computer-readable medium of any of aspects 1 through 11, further including operations, features, circuitry, logic, means, or instructions, or any combination thereof for determining the threshold temperature based at least in part on a temperature history of the memory device including one or more previous operating temperatures of the memory device.

Aspect 13: The method, apparatus, or non-transitory computer-readable medium of aspect 12, further including operations, features, circuitry, logic, means, or instructions, or any combination thereof for determining the threshold temperature based at least in part on a temperature difference between at least one of the one or more previous operating temperatures and a threshold operating temperature of the memory device.

Aspect 14: The method, apparatus, or non-transitory computer-readable medium of any of aspects 1 through 13, where the threshold temperature is based at least in part on a first temperature at which a first threshold voltage distribution associated with a first logic state overlaps with a second threshold voltage distribution associated with a second logic state.

Aspect 15: The method, apparatus, or non-transitory computer-readable medium of any of aspects 1 through 14, where the one or more dummy access operations includes one or more dummy read operations.

Aspect 16: The method, apparatus, or non-transitory computer-readable medium of aspect 15, where the one or more dummy read operations are performed at one or more non-allocated virtual blocks, one or more virtual blocks that are flagged for erasing, or any combination thereof.

It should be noted that the described techniques include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally, or alternatively (e.g., in an alternative example), be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A memory system, comprising:
   one or more memory devices; and
   one or more controllers coupled with the one or more memory system devices and configured to cause the memory system to:
   measure, at the memory system while in an idle mode, a temperature of a memory device of the memory system at a first time;
   determine whether the temperature of the memory device at the first time is lower than a threshold temperature;
   determine a quantity of one or more dummy access operations based at least in part on a difference between the threshold temperature and the temperature of the memory device at the first time; and
   perform, while in the idle mode, the one or more dummy access operations at the memory device based at least in part on determining that the temperature at the first time is lower than the threshold temperature.

2. The memory system of claim 1, wherein performing the one or more dummy access operations is configured to increase the temperature of the memory device.

3. The memory system of claim 1, wherein the one or more controllers is further configured to cause the memory system to:
   enter the idle mode at a previous time before the first time, wherein measuring the temperature of the memory device at the first time is based at least in part on a first duration elapsing between the previous time and the first time.

4. The memory system of claim 1, wherein the one or more controllers is further configured to cause the memory system to:
   measure, while in the idle mode, the temperature of the memory device at a second time based at least in part on a second duration elapsing between the first time and the second time;
   determine whether the temperature of the memory device at the second time is lower than the threshold temperature; and
   determine whether to perform a second one or more dummy access operations at the memory device while in the idle mode based at least in part on determining whether the temperature at the second time is lower than the threshold temperature.

5. The memory system of claim 4, wherein the one or more controllers is further configured to cause the memory system to:

determine that the temperature of the memory device at the second time is greater than the threshold temperature; and
determine to refrain from performing the second one or more dummy access operations based at least in part on determining that the temperature of the memory device at the second time is greater than the threshold temperature.

6. The memory system of claim 4, wherein the one or more controllers is further configured to cause the memory system to:
determine that the temperature of the memory device at the second time is lower than the threshold temperature; and
determine to perform the second one or more dummy access operations based at least in part on determining that the temperature of the memory device at the second time is lower than the threshold temperature.

7. The memory system of claim 4, wherein the one or more controllers is further configured to cause the memory system to:
determine a duration for the second duration based at least in part on a rate of change of the temperature of the memory device in response to performing the one or more dummy access operations.

8. The memory system of claim 1, wherein the one or more controllers is further configured to cause the memory system to:
measure, at the memory system while in the idle mode, a temperature of a second memory device of the memory system at the first time;
determine whether the temperature of the second memory device at the first time is lower than the threshold temperature; and
perform, while in the idle mode, one or more dummy access operations at the second memory device based at least in part on determining that the temperature of the second memory device at the first time is lower than the threshold temperature.

9. The memory system of claim 1, wherein the one or more controllers is further configured to cause the memory system to:
determine the threshold temperature based at least in part on a temperature history of the memory device comprising one or more previous operating temperatures of the memory device.

10. The memory system of claim 9, wherein the one or more controllers is further configured to cause the memory system to:
determine the threshold temperature based at least in part on a temperature difference between at least one of the one or more previous operating temperatures and a threshold operating temperature of the memory device.

11. The memory system of claim 1, wherein the one or more dummy access operations comprises one or more dummy read operations.

12. The memory system of claim 11, wherein the one or more dummy read operations are performed at one or more non-allocated virtual blocks, one or more virtual blocks that are flagged for erasing, or any combination thereof.

13. A memory system, comprising:
one or more memory devices; and
one or more controllers coupled with the one or more memory devices and configured to cause the memory system to:
receive, from a host system, an indication of a duration of a duration between entering an idle mode and measuring a temperature of a memory device of the memory system;
enter an idle mode at a first time;
measure, at the memory system while in the idle mode, the temperature of the memory device at a second time after the first time, wherein measuring the temperature of the memory device at the second time is based at least in part on the duration elapsing between the first time and the second time;
determine whether the temperature of the memory device at the first time is lower than a threshold temperature; and
perform, while in the idle mode, one or more dummy access operations at the memory device based at least in part on determining that the temperature at the first time is lower than the threshold temperature.

14. A memory system, comprising:
one or more memory devices; and
one or more controllers coupled with the one or more memory devices and configured to cause the memory system to:
receive, from a host system, an indication of a duration between measuring a temperature of a memory device of the memory system at a first time and at a second time;
measure, at the memory system while in an idle mode, a temperature of a memory device of the memory system at the first time;
determine whether the temperature of the memory device at the first time is lower than a threshold temperature;
perform, while in the idle mode, one or more dummy access operations at the memory device based at least in part on determining that the temperature at the first time is lower than the threshold temperature;
measure, while in the idle mode, the temperature of the memory device at the second time based at least in part on the duration elapsing between the first time and the second time;
determine whether the temperature of the memory device at the second time is lower than the threshold temperature; and
determine whether to perform a second one or more dummy access operations at the memory device while in the idle mode based at least in part on determining whether the temperature at the second time is lower than the threshold temperature.

15. A memory system, comprising:
one or more memory devices; and
one or more controllers coupled with the one or more memory devices and configured to cause the memory system to:
measure, at the memory system while in an idle mode, a temperature of a memory device of the memory system at a first time;
determine whether the temperature of the memory device at the first time is lower than a threshold temperature, wherein the threshold temperature is based at least in part on a first temperature at which a first threshold voltage distribution associated with a first logic state overlaps with a second threshold voltage distribution associated with a second logic state; and
perform, while in the idle mode, one or more dummy access operations at the memory device based at least in part on determining that the temperature at the first time is lower than the threshold temperature.

16. A non-transitory computer-readable medium storing code comprising instructions which, when executed by one or more processors of an electronic device, cause the electronic device to:
   measure, at a memory system while in an idle mode, a temperature of a memory device of the memory system at a first time;
   determine whether the temperature of the memory device at the first time is lower than a threshold temperature;
   determine a quantity of one or more dummy access operations based at least in part on a difference between the threshold temperature and the temperature of the memory device at the first time; and
   perform, while in the idle mode, the one or more dummy access operations at the memory device based at least in part on determining that the temperature at the first time is lower than the threshold temperature.

17. The non-transitory computer-readable medium of claim 16, wherein performing the one or more dummy access operations is configured to increase the temperature of the memory device.

18. The non-transitory computer-readable medium of claim 16, wherein the instructions, when executed by the one or more processors of the electronic device, further cause the electronic device to:
   enter the idle mode at a previous time before the first time, wherein measuring the temperature of the memory device at the first time is based at least in part on a first duration elapsing between the previous time and the first time.

19. The non-transitory computer-readable medium of claim 16, wherein the instructions, when executed by the one or more processors of the electronic device further cause the electronic device to:
   measure, while in the idle mode, the temperature of the memory device at a second time based at least in part on a second duration elapsing between the first time and the second time;
   determine whether the temperature of the memory device at the second time is lower than the threshold temperature; and
   determine whether to perform a second one or more dummy access operations at the memory device while in the idle mode based at least in part on determining whether the temperature at the second time is lower than the threshold temperature.

20. The non-transitory computer-readable medium of claim 19, wherein the instructions, when executed by the one or more processors of the electronic device further cause the electronic device to:
   determine that the temperature of the memory device at the second time is greater than the threshold temperature; and
   determine to refrain from performing the second one or more dummy access operations based at least in part on determining that the temperature of the memory device at the second time is greater than the threshold temperature.

21. The non-transitory computer-readable medium of claim 19, wherein the instructions, when executed by the one or more processors of the electronic device further cause the electronic device to:
   determine that the temperature of the memory device at the second time is lower than the threshold temperature; and
   determine to perform the second one or more dummy access operations based at least in part on determining that the temperature of the memory device at the second time is lower than the threshold temperature.

22. The non-transitory computer-readable medium of claim 16, wherein the instructions, when executed by the one or more processors of the electronic device further cause the electronic device to:
   measure, at the memory system while in the idle mode, a temperature of a second memory device of the memory system at the first time;
   determine whether the temperature of the second memory device at the first time is lower than the threshold temperature; and
   perform, while in the idle mode, one or more dummy access operations at the second memory device based at least in part on determining that the temperature of the second memory device at the first time is lower than the threshold temperature.

23. A non-transitory computer-readable medium storing code comprising instructions which, when executed by one or more processors of an electronic device cause the electronic device to: receive, from a host system, an indication of a duration a duration between entering an idle mode and measuring a temperature of a memory device of a memory system; enter an idle mode at a first time; measure, at the memory system while in the idle mode, the temperature of the memory device at a second time after the first time, wherein measuring the temperature of the memory device at the second time is based at least in part on the duration elapsing between the first time and the second time; determine whether the temperature of the memory device at the first time is lower than a threshold temperature; and perform, while in the idle mode, one or more dummy access operations at the memory device based at least in part on determining that the temperature at the first time is lower than the threshold temperature.

24. A method by a memory system, comprising:
   measuring, at the memory system while in an idle mode, a temperature of a memory device of the memory system at a first time;
   determining whether the temperature of the memory device at the first time is lower than a threshold temperature;
   determining a quantity of one or more dummy access operations based at least in part on a difference between the threshold temperature and the temperature of the memory device at the first time; and
   performing, while in the idle mode, the one or more dummy access operations at the memory device based at least in part on determining that the temperature at the first time is lower than the threshold temperature.

* * * * *